United States Patent
Barton et al.

(10) Patent No.: US 6,852,976 B2
(45) Date of Patent: Feb. 8, 2005

(54) INFRARED DETECTOR ARRAY WITH IMPROVED SPECTRAL RANGE AND METHOD FOR MAKING THE SAME

(75) Inventors: Jeffrey B. Barton, Goleta, CA (US); Theodore R. Hoelter, Santa Barbara, CA (US)

(73) Assignee: Indigo Systems Corporation, Goleta, CA (US)

( * ) Notice: Subject to any disclaimer, the term of this patent is extended or adjusted under 35 U.S.C. 154(b) by 87 days.

(21) Appl. No.: 10/259,046

(22) Filed: Sep. 26, 2002

(65) Prior Publication Data

US 2004/0061056 A1 Apr. 1, 2004

(51) Int. Cl.$^7$ .............................................. H01L 27/14
(52) U.S. Cl. ................................................... 250/338.4
(58) Field of Search ...................................... 250/338.4

(56) References Cited

U.S. PATENT DOCUMENTS

| | | | |
|---|---|---|---|
| 5,264,699 A | | 11/1993 | Barton et al. ............ 250/338.4 |
| 5,574,285 A | * | 11/1996 | Marion et al. ......... 250/370.13 |
| 5,756,999 A | | 5/1998 | Parrish et al. .............. 250/332 |
| 5,808,329 A | * | 9/1998 | Jack et al. .................. 257/188 |
| 6,028,309 A | | 2/2000 | Parrish et al. .............. 250/332 |
| 6,127,203 A | * | 10/2000 | Wan et al. ..................... 438/67 |
| 6,147,391 A | * | 11/2000 | Bowers et al. .............. 257/458 |

FOREIGN PATENT DOCUMENTS

WO   WO 96/34418 A1 * 11/1996 ........... H01L/31/18

OTHER PUBLICATIONS

Cohen et al., An Indium Gallium Arsenide Visible/Swir Focal Plane Array for Low Light Level Imaging, Aug. 1999, Sensors Unlimited, Inc., Princeton, NJ, (Report No. A252093 from http://www.stormlngmedia.us/25/2520/A252093.html, as of Sep. 24, 2004).

* cited by examiner

*Primary Examiner*—Constantine Hannaher
(74) *Attorney, Agent, or Firm*—MacPherson Kwok Chen & Heid LLP; Greg J. Michelson

(57) ABSTRACT

An infrared detector is disclosed having a first substrate made of indium phosphide and a first layer formed on the first substrate and made of indium gallium arsenide. The infrared detector further includes a second substrate, which is made of silicon and has a readout integrated circuit that is electrically coupled to the first layer. After the indium gallium arsenide material is formed, the first substrate is substantially thinned or removed by mechanical techniques and/or a chemical etch process to extend the spectral range of the infrared detector to wavelengths beyond that of a conventional infrared detector.

27 Claims, 4 Drawing Sheets

INFRARED DETECTOR ARRAY WITH IMPROVED SPECTRAL RANGE AND METHOD FOR MAKING THE SAME

BACKGROUND

1. Field of the Invention

The present invention relates generally to infrared imaging devices and, more particularly, to an improved infrared detector.

2. Related Art

Imaging devices that detect various regions of the electromagnetic spectrum are used in a variety of commercial and military applications. One type of imaging device uses a focal plane array (FPA) to detect infrared radiation. An FPA, for example, may be formed from an array of infrared detectors, with each infrared detector functioning as a pixel to produce a two-dimensional image. The change in signal level output of each infrared detector due to received incident infrared radiation is translated into a time-multiplexed electrical signal by circuitry known as the read out integrated circuit (ROIC). The combination of the ROIC and the infrared detector array is commonly known as a FPA or infrared FPA. FPAs (e.g., microbolometer FPAs) are described in further detail in U.S. Pat. Nos. 5,756,999 and 6,028,309, which are herein incorporated by reference in their entirety.

FIG. 1 shows a cross-sectional view of one exemplary type of a conventional infrared FPA 100, which includes a substrate 102 made of indium phosphide (InP), an active detection layer 104 made of indium gallium arsenide (InGaAs), and a substrate 108 made of silicon (Si). Active detection layer 104 serves to detect infrared radiation 110 and is electrically coupled to substrate 108 through bump-bonds 106 (e.g., indium bump interconnects). The ROIC is formed on substrate 108 to read out the data collected by active detection layer 104.

Substrate 102 is required to grow the InGaAs epitaxial layer that forms active detection layer 104. For example, $In_{(x)}Ga_{(1-x)}As$ is typically selected to be $In_{(0.53)}Ga_{(0.47)}As$, because its lattice constant matches the lattice constant of the InP material of substrate 102. After the InGaAs epitaxial layer is formed, the InP material of substrate 102 generally functions as a transparent window that passes the infrared radiation 110 that is to be detected by active detection layer 104. Active detection layer 104 of $In_{(0.53)}Ga_{(0.47)}As$ and substrate 102 of InP, however, result in infrared FPA 100 having a limited spectral range or spectral sensitivity between 0.9–1.7 μm. As a result, there is a need for an improved infrared detector array that provides a wider spectral range.

BRIEF SUMMARY

Infrared detector arrays and methods for making the infrared detector arrays are disclosed herein. In accordance with an embodiment of the present invention, an improved infrared detector is disclosed that provides a greater spectral sensitivity than conventional infrared detectors. The improved infrared detector may also operate with a lower signal loss (e.g., less distortion or performance degradation).

For example, in accordance with an embodiment of the present invention, an infrared detector is disclosed having a first substrate made of indium phosphide and a first layer formed on the first substrate and made of indium gallium arsenide. The infrared detector further includes a second substrate, which may be made of silicon and has a readout integrated circuit that is electrically coupled to the first layer. After the indium gallium arsenide material is formed, the first substrate is substantially removed by mechanical techniques and/or a chemical etch process to extend the spectral sensitivity of the infrared detector to wavelengths beyond that of a conventional infrared detector.

In accordance with another embodiment, the infrared detector may include additional substrate layers to passivate the indium gallium arsenide material. Furthermore, in accordance with another embodiment of the present invention, an annealing process may be performed to relieve lattice mismatch stress and dislocation in the indium gallium arsenide material if its lattice constant differs from the lattice constant of the indium phosphide material.

More specifically, in accordance with one embodiment of the present invention, an infrared detector includes a first substrate comprised of an indium phosphide material having a thickness of less than 20 μm; a first layer comprised of an indium gallium arsenide material and formed on the first substrate, with the first layer serving to detect infrared radiation; and a second substrate having a readout integrated circuit that is electrically coupled to the first layer.

In accordance with another embodiment of the present invention, a method of fabricating an infrared detector includes providing a first substrate comprised of an indium phosphide material; providing a first layer comprised of an indium gallium arsenide material that is formed on the first substrate; providing a second substrate having a readout integrated circuit, wherein the readout integrated circuit is electrically coupled to the indium gallium arsenide material that detects infrared radiation; and thinning the first substrate to substantially remove the indium phosphide material.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

The preferred embodiments of the present invention and their advantages are best understood by referring to the detailed description that follows. It should be appreciated

DETAILED DESCRIPTION

Figure 2:
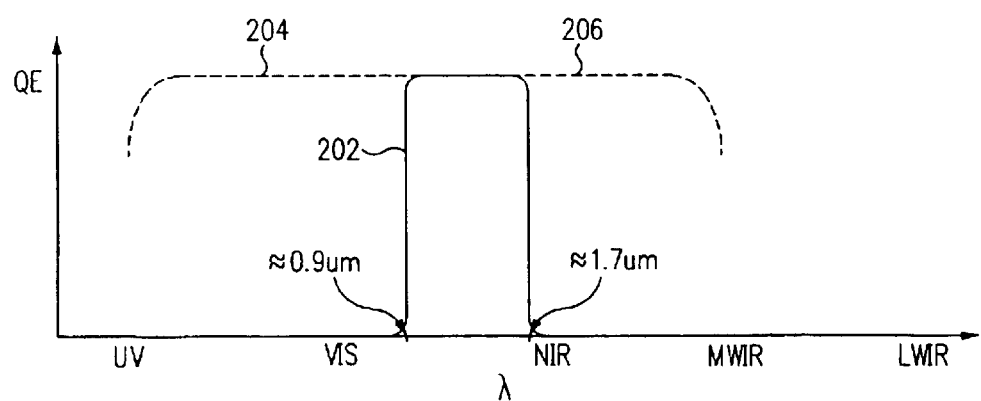
FIG. 2 shows a graph of quantum efficiency versus wavelength for a conventional $In_{(0.53)}Ga_{(0.47)}As$ focal plane array and for a focal plane array in accordance with one or more embodiments of the present invention.

FIG. 2 shows a graph of quantum efficiency (QE) versus wavelength (λ) for an infrared focal plane array (FPA). The general wavelength regions for the portion of the optical spectrum identified include ultraviolet (UV), visible (VIS), near infrared (NIR), medium wave infrared (MWIR), and long wave infrared (LWIR).

Figure 1:
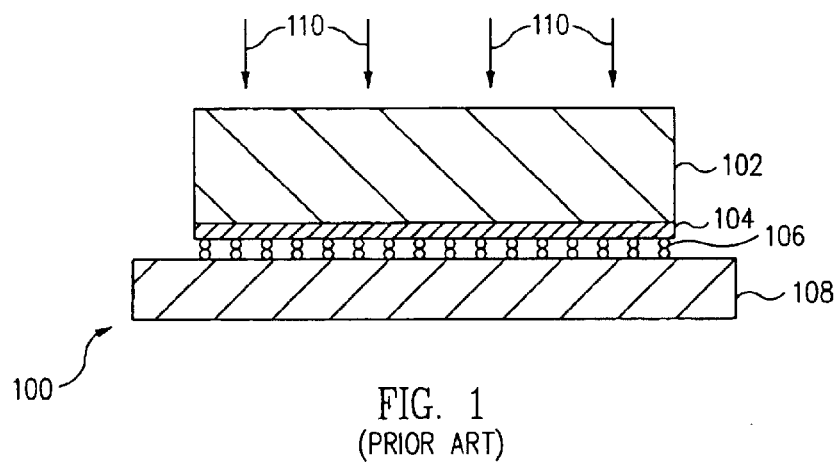
FIG. 1 shows a cross-sectional view of a conventional infrared focal plane array.

A data plot 202 indicates the performance characteristics of a conventional $In_{(0.53)}Ga_{(0.47)}As$ FPA, such as discussed in reference to FIG. 1. Data plot 202 shows that the conventional $In_{(0.53)}Ga_{(0.47)}As$ FPA (as discussed in reference to FIG. 1 with active detection layer 104 of $In_{(0.53)}Ga_{(0.47)}As$) generally has a spectral range from 0.9 to 1.7 µm. This spectral range is limited at the shorter wavelengths (i.e., 0.9 µm) by the InP material of substrate 102, which absorbs the shorter wavelengths (e.g., the wavelengths in the UV or VIS region). The InP material of substrate 102 could be viewed as functioning as a long-pass filter that allows only the wavelengths of approximately 0.9 µm or greater to pass (i.e., a low-pass filter if viewed in the frequency domain).

As noted earlier, the InP material is required to grow the InGaAs epitaxial layer that forms active detection layer 104. However, besides limiting the spectral range, the InP material also results in performance degradations due to its non-ideal transparent window characteristics.

Figure 3:
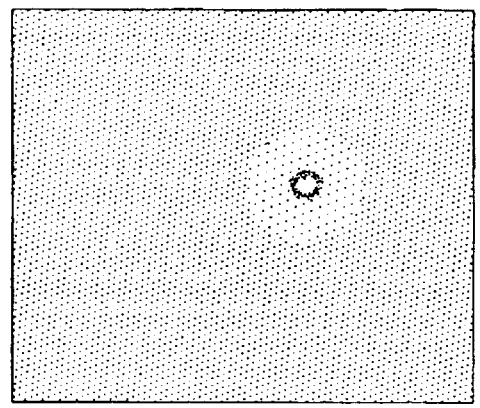
FIG. 3 illustrates an image taken with a conventional $In_{(0.53)}Ga_{(0.47)}As$ focal plane array.
Figure 4:
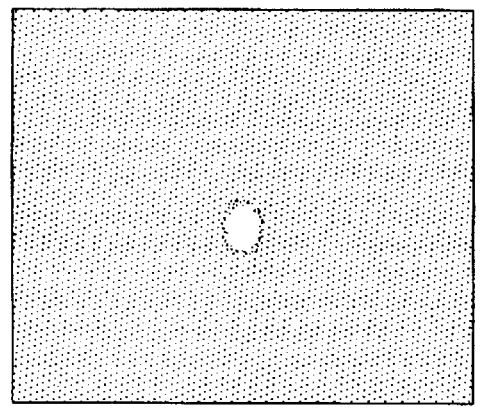
FIG. 4 illustrates an image taken with an $In_{(0.53)}Ga_{(0.47)}As$ focal plane array in accordance with an embodiment of the present invention.

For example, FIG. 3 illustrates an image taken with a conventional InGaAs focal plane array and FIG. 4 illustrates essentially the same image taken with an InGaAs focal plane array in accordance with an embodiment of the present invention. The bright spot, shown slightly off-center in FIG. 3 and approximately centered in FIG. 4, was produced by a 1.5 µm laser.

As can be seen in FIG. 3, a dark ring immediately surrounds the bright spot, with the dark ring surrounded by a cluster of detections, producing a halo effect. The dark ring and cluster of detections are caused by undesired reflections, scattering, and/or diffraction due to imperfections in the InP material of substrate 102. When the InP material is substantially removed, as discussed in further detail herein in accordance with an embodiment of the present invention, the undesired characteristics or performance degradations are eliminated. For example, the dark ring and erroneous cluster of detections are not present in the image illustrated in FIG. 4, which was taken with an InGaAs FPA in accordance with an embodiment of the present invention.

Figure 5:
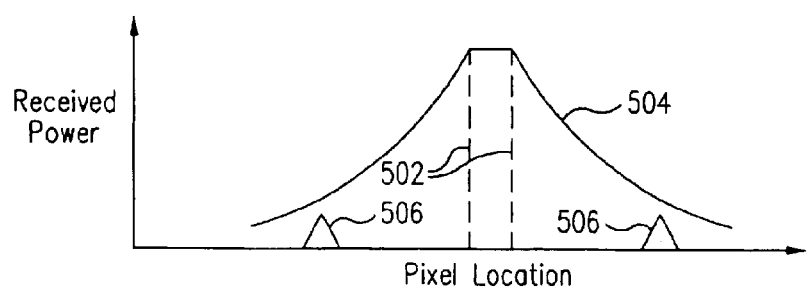
FIG. 5 is a graph of received power versus frequency for a conventional infrared focal plane array.

FIG. 5, for example, shows a graph of received power versus pixel location where different FPA pixels record different frequencies of light as may result when a tunable laser source is passed through a spectrometer and the ensuing spectrum imaged onto an FPA. Instead of exclusively recording the laser's unique frequencies as a function of FPA pixel position, scattered light from the intense primary mode 502 is registered on adjacent pixels and results in erroneous determination of laser power as a function of frequency (identified by a plot 504). Specifically, low power level spectral signals, like side modes 506 that are often found in tunable lasers, are difficult to discriminate from the erroneous signal (plot 504) generated by scattered light from the intense primary mode 502. Discrimination of side modes 506 or other low intensity signals in close proximity to the primary mode or other high intensity signals would be greatly enhanced by an infrared detector in accordance with an embodiment of the present invention.

FIGS. 6a through 6e illustrate a method of fabricating an InGaAs focal plane array 600 in accordance with an embodiment of the present invention. In reference to FIG. 6a, FPA 600 includes a substrate 602 made of indium phosphide (InP), an active detection layer 604 made of indium gallium arsenide (InGaAs), and a substrate 608 made of silicon (Si). Substrate 602 is used to grow the InGaAs epitaxial layer that forms active detection layer 604.

Figure 6A:
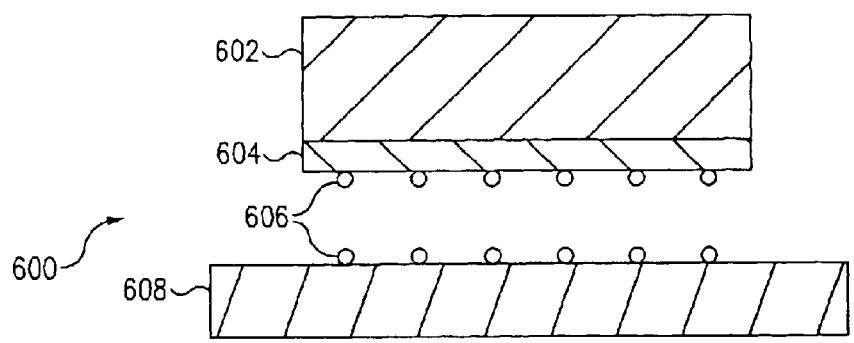
FIGS. 6a through 6e illustrate a method of fabricating a focal plane array in accordance with an embodiment of the present invention.
Figure 6B:
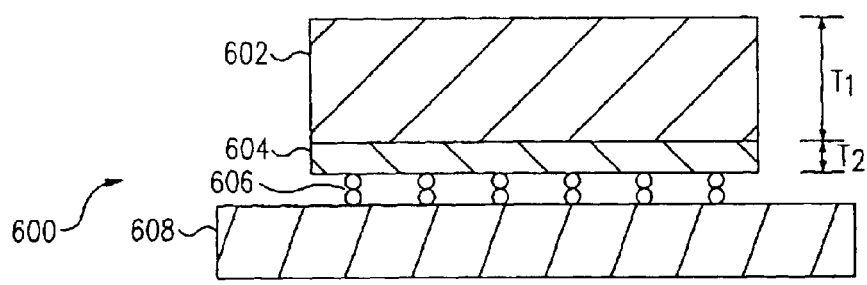

Active detection layer 604 detects infrared radiation and is electrically coupled to substrate 608 through bump-bonds 606 (e.g., indium bump interconnects), as shown in FIG. 6b. The read out integrated circuit (ROIC) is formed on substrate 608 to read out the data collected by active detection layer 604. An exemplary thickness for substrate 602 and active detection layer 604 (indicated by corresponding labels "T1" and "T2" in FIG. 6b) is 600 µm and 3 µm, respectively.

As an optional step (illustrated in FIG. 6c), an epoxy or other adhesive material 610 may be wicked or back-filled into the interstices or spaces around bump-bonds 606 and between active detection layer 604 and substrate 608. Adhesive material 610 serves, for example, to further increase the bonding between active detection layer 604 and substrate 608.

Figure 6C:
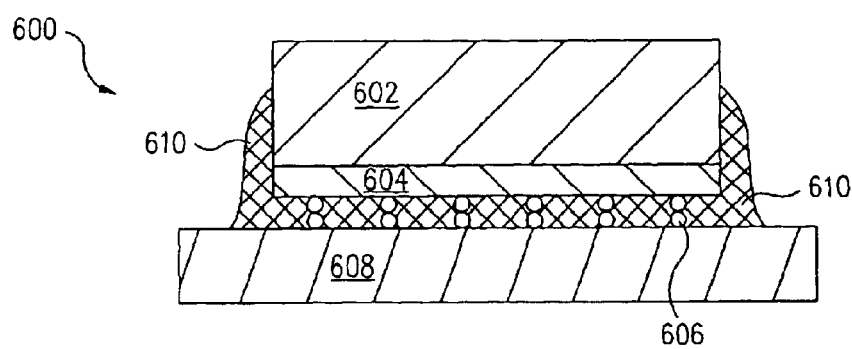
Figure 6D:
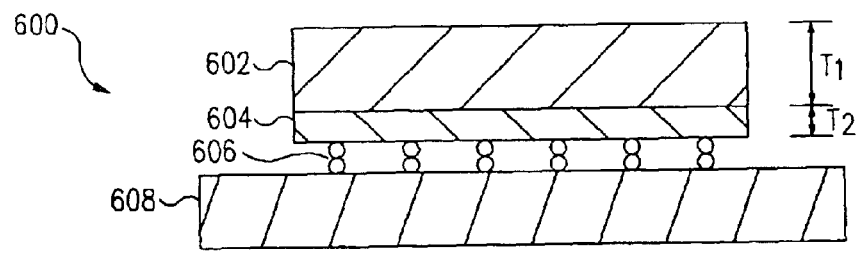

Referring to FIG. 6d, substrate 602 is thinned from a thickness (labeled "T1" in FIG. 6b) of approximately 600 µm to within a range of approximately 10–100 µm. For example, substrate 602 may be thinned from the conventional thickness of 600 µm to 30 µm by mechanical lapping and polishing techniques. The mechanical lapping thins substrate 602 to substantially the desired thickness while the polishing, which follows the mechanical lapping, further thins substrate 602 to precisely the desired thickness and provides a smooth surface and uniform thickness across substrate 602. Alternatively, or in some combination with the mechanical lapping and polishing, diamond-point turning or diamond-point fly cutting may be utilized to thin substrate 602 to the desired thickness.

Figure 6E:
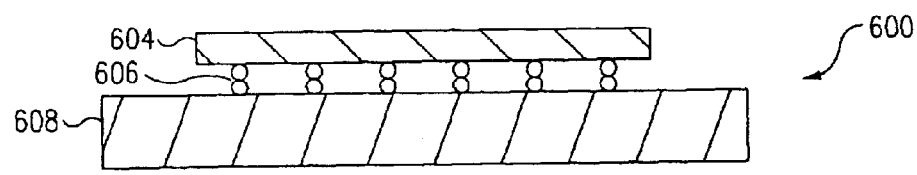

As shown in FIG. 6e, the remaining portion of substrate 602 is substantially removed by employing a chemical etch. The chemical etch is composed of hydrochloric acid (HCl), HCl combined with water ($H_2O$), or HCl combined with $H_2O$ and phosphoric acid ($H_3PO_4$). For example, the chemical etch composition for HCl combined with $H_2O$ (in other words $HCl:H_2O$) may fall within the mixture range of 1–0.1:0–0.9, respectively, where this indicates that the mixture ranges from entirely HCl to one part HCl and nine parts $H_2O$. As another example, the chemical etch composition for $HCl:H_3PO_4:H_2O$ may fall within the mixture range of 1–0.1:0–0.9:0–0.9, respectively.

As an alternative and in accordance with an embodiment of the present invention, the thinning techniques (e.g., mechanical lapping, polishing, or diamond-point turning) discussed in reference to FIG. 6d may be skipped. Substrate 602 (of FIG. 6b or 6c) would then be substantially thinned or removed by performing the chemical etch process discussed in reference to FIG. 6e.

The time necessary to remove or thin substrate 602 may be significantly longer by using solely the chemical etch process rather than in combination with the mechanical thinning techniques. Additionally, if adhesive material 610 is present (as shown in FIG. 6c), the chemical etch will not remove or dissolve adhesive material 610 along the sides of substrate 602. Consequently, as the chemical etch thins substrate 602, a portion of adhesive material 610 that was adjacent to the etched portions of substrate 602 will be unsupported. The unsupported portion of adhesive material 610 may be removed by various techniques, such as plasma ashing, if deemed necessary. Alternatively, the unsupported portion of adhesive material 610 may be allowed to fold or collapse onto active detection layer 604 if adhesive material 610 does not interfere with the active portions or areas of active detection layer 604.

By substantially removing the InP material of substrate 602, the performance degradations associated with the InP material are eliminated. Furthermore, the spectral range of FPA 600 is wider than conventional NIR infrared FPAs. As shown in FIG. 2, data plot 202 (as discussed above) illustrates the limited spectral range for the conventional NIR FPA due to the InP material absorbing the shorter wavelengths that are less than 0.9 µm. A data plot 204 (FIG. 2) illustrates the improved spectral range of an InGaAs FPA in accordance with an embodiment of the present invention, with the InP material of substrate 602 substantially removed. Data plot 204 shows that the InGaAs FPA (e.g., InGaAs FPA 600) is not limited by the 0.9 µm wavelength cutoff and continues to detect wavelengths (i.e., maintain adequate quantum efficiency) at least into the visible (VIS) and ultraviolet (UV) regions.

Figure 7:
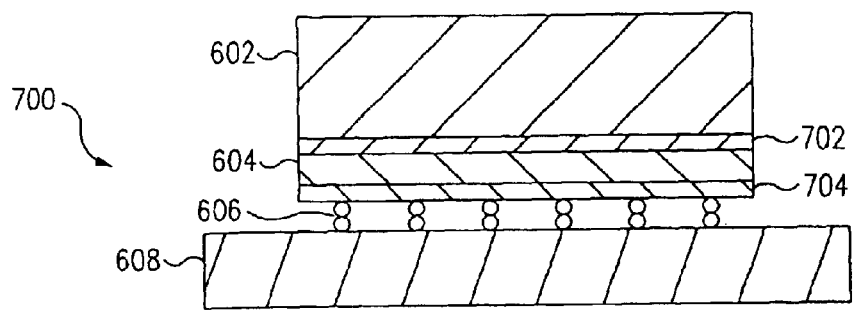
FIG. 7 illustrates a cross-sectional view of a focal plane array in accordance with an embodiment of the present invention.

Referring to FIG. 6d and as discussed above, substrate 602 is made of InP and active detection layer 604 is made of InGaAs. Alternatively, in accordance with an embodiment of the present invention, an InGaAs FPA 700 (shown in FIG. 7) includes substrate 602 made of InP, a layer 702, active detection layer 604 made of InGaAs, a layer 704, and substrate 608 made of Si.

Layers 702 and 704 are made of InP. For example, layers 702 and 704 are made of highly-doped InP, with layer 702 having a thickness of approximately 0.05–0.1 µm and layer 704 having a thickness of approximately 0.3 µm. The read out integrated circuit (ROIC) is formed on substrate 608 to read out the data collected by active detection layer 604. Active detection layer 604 detects infrared radiation and is electrically coupled to substrate 608 through bump-bonds 606 (e.g., indium bump interconnects) and layer 704.

InGaAs FPA 700 may be thinned in a similar fashion as described in reference to FIGS. 6a through 6e for InGaAs FPA 600. For example, substrate 602 may be thinned by mechanical techniques (e.g., lapping and polishing) prior to additional thinning or removal by the chemical etch. Alternatively, substrate 602 may be thinned or completely removed solely by the chemical etch.

Layer 704 serves as a passivation layer for active detection layer 604. Substrate 602 and layer 702 are used to grow the InGaAs epitaxial layer that forms active detection layer 604. During the thinning process, some portion of substrate 602 may ultimately remain. Alternatively, substrate 602 may be completely removed by the chemical etch process, leaving only layer 702 or a thinned portion of layer 702 that has not been removed by the chemical etch. Layer 702 or the remaining portion of layer 702 that has survived the chemical etch process will serve as a passivation layer for active detection layer 604. Thus, layers 702 and 704 serve to passivate active detection layer 604 and may offer some protection during the thinning process.

Layer 704 may be protected to some extent from the chemical etch process by the wicked epoxy (e.g., adhesive material 610 as discussed in reference to FIG. 6c) if utilized. Layer 702 is interdiffused with active detection layer 604 due to the growth process/temperature process of InP to InGaAsP to InGaAs. The chemical etch tends to be selective in that it has a high etch rate for InP, a very slow or nonexistent etch rate for InGaAs, and a decreasing etch rate in the interdiffused region.

It should be understood that substrate 602 is substantially, if not entirely removed, during the thinning process to provide for the detection by the FPA of the shorter wavelengths (e.g., wavelengths of less than 0.9 µm). In general, the very thin remaining portion of substrate 602 or layer 702, after the thinning process, will not appreciably block the shorter wavelengths or detrimentally affect the FPA's performance.

As discussed herein, the InGaAs material of active detection layer 604 typically has the composition of $In_{(0.53)}Ga_{(0.47)}As$, because its lattice constant matches the lattice constant of the InP material of substrate 602. Unfortunately, the specific composition of $In_{(0.53)}Ga_{(0.47)}As$ substantially limits the upper spectral range of the FPA to 1.7 µm (e.g., functions as a short-pass filter). If the InGaAs material of active detection layer 604 grown on the InP material of substrate 602 (or layer 702) differs from the specific $In_{(0.53)}Ga_{(0.47)}As$ composition, the upper spectral range of the FPA may be extended, for example, into the medium wave infrared (MWIR) region (see FIG. 2), such as to 2.5 µm. However, the FPA provides unsatisfactory performance due to the lattice mismatch, which results in noise and various other performance degradations in active detection layer 604.

In accordance with an embodiment of the present invention, after substantially removing the InP material of substrate 602 (or substrate 602 and layer 702), the FPA (e.g., FPA 600 or 700) is exposed to an annealing process. The annealing process is performed to relieve the stress and cure degradations or deformities associated with the lattice mismatch after the InGaAs material is grown with a composition that differs from the specific composition of $In_{(0.53)}Ga_{(0.47)}As$.

For example, the annealing process may be performed at a temperature range of 250–500 ° C. for a duration of one second to thirty six hours. This annealing process permits, for example, an $In_{(x)}Ga_{(1-x)}As$ material, with x equal to 0.85 or 0.92, to have a satisfactory spectral range of 2.5 µm or 3.0 µm, respectively.

By substantially removing the InP material of substrate 602 and then performing an annealing process, the performance degradations associated with the InP material and lattice mismatch between the InP material of substrate 602 (or substrate 602 and layer 702) and InGaAs material of active detection layer 604 are substantially eliminated. Consequently, the spectral range of the FPA (e.g., FPA 600 or 700) is wider than conventional FPAs while maintaining satisfactory levels of quantum efficiency. Furthermore, the increased upper spectral range may be achieved, to some extent, even without the annealing process using the techniques discussed herein.

Referring to FIG. 2, for example, data plot 202 illustrates the limited spectral range for the conventional InGaAs FPA due to the InP material absorbing the shorter wavelengths that are less than 0.9 µm and the specific $In_{(0.53)}Ga_{(0.47)}As$ composition limiting the upper spectral range to 1.7 µm. Data plot 204 shows that, after substantially removing the InP material of substrate 602, the FPA (e.g., FPA 600 or 700) is not limited by the 0.9 µm wavelength cutoff and continues to detect the shorter wavelengths (i.e., maintain adequate quantum efficiency). A data plot 206 illustrates the improved spectral range of a FPA, in accordance with an embodiment of the present invention, after the InP material is substantially removed and the annealing process is performed to cure the lattice mismatch defects in the InGaAs material that has a composition that differs from the specific composition of $In_{(0.53)}Ga_{(0.47)}As$. Data plot 206 shows that the FPA is not limited by the 1.7 μm wavelength upper spectral range cutoff and continues to detect longer wavelengths (i.e., maintain adequate quantum efficiency) while providing satisfactory performance.

Further details regarding FPAs can be found in U.S. patent application Ser. No. 10/085,226 entitled "Microbolometer Focal Plane Array Methods and Circuitry" filed Feb. 27, 2002, U.S. patent application Ser. No. 09/802,448 entitled "Novel Crystal Thinning Method for Improved Yield and Reliability" filed Mar. 9, 2001, U.S. patent application Ser. No. 09/876,780 entitled "Method for Electrically Interconnecting Large Contact Arrays Using Eutectic Alloy Bumping" filed Jun. 6, 2001, and U.S. patent application Ser. No. 09/972,084 entitled "Electro-Optical Sensor Arrays With Reduced Sensitivity to Defects" filed Oct. 4, 2001, which are herein incorporated by reference in their entirety.

Embodiments described above illustrate but do not limit the invention. It should also be understood that numerous modifications and variations are possible in accordance with the principles of the present invention. Accordingly, the scope of the invention is defined only by the following claims.

What is claim is:

1. A method of fabricating an infrared detector, the method comprising:
   providing a first substrate comprised of an indium phosphide material;
   providing a first layer comprised of an indium gallium arsenide material that is formed on the first substrate;
   providing a second layer comprised of a highly-doped indium phosphide material between the first substrate and the first layer;
   providing a second substrate having a readout integrated circuit, wherein the readout integrated circuit is electrically coupled to the indium gallium arsenide material that detects infrared radiation; and
   thinning the first substrate to substantially remove the indium phosphide material.

2. The method of claim 1, wherein the first substrate is thinned by a mechanical technique to a thickness of approximately 10 to 100 μm, which is followed by a chemical etch to substantially remove the indium phosphide material.

3. The method of claim 2, wherein the mechanical technique comprises at least one of a mechanical lapping, a mechanical polishing, and a diamond-point turning process.

4. The method of claim 2, wherein the chemical etch comprises a hydrochloric acid, hydrochloric acid combined with water, or hydrochloric acid combined with water and phosphoric acid.

5. The method of claim 1, wherein the second substrate is comprised of silicon.

6. The method of claim 1, wherein the composition of the indium gallium arsenide material is $In_{.53}Ga_{.47}As$.

7. The method of claim 1, wherein the indium phosphide material is substantially removed to extend the infrared detector's spectral range to wavelengths less than 0.9 μm.

8. The method of claim 1, further comprising
   providing a third layer comprised of a highly-doped indium phosphide material, wherein the third layer is formed on the first layer and positioned between the first layer and the second substrate.

9. The method of claim 8, wherein the second layer and the third layer serve as passivation layers for the indium gallium arsenide material.

10. The method of claim 8, wherein the second layer has a thickness of approximately 0.05 to 0.1 μm and the third layer has a thickness of approximately 0.3 μm.

11. An infrared detector fabricated according to the method of claim 8.

12. The method of claim 1, wherein the readout integrated circuit is electrically coupled to the first layer through bump-bond interconnects and wherein an adhesive material further couples the first layer to the second substrate.

13. The method of claim 1, further comprising performing an annealing process to treat the indium gallium arsenide material having a lattice constant that differs from the lattice constant of the indium phosphide material.

14. The method of claim 13, wherein the composition of the indium gallium arsenide material differs from $In_{.53}Ga_{.47}As$ and the annealing process cures the lattice mismatch defects and extends the infrared detector's spectral range to wavelengths greater than 1.7 μm.

15. An infrared detector fabricated according to the method of claim 13.

16. An infrared detector fabricated according to the method of claim 1.

17. An infrared detector comprising:
    a first substrate comprised of an indium phosphide material having a thickness of less than 20 μm;
    a first layer comprised of an indium gallium arsenide material and formed on the first substrate, the first layer serves to detect infrared radiation;
    a second layer made of highly-doped indium phosphide material between the first substrate and the first layer; and
    a second substrate having a readout integrated circuit that is electrically coupled to the first layer.

18. The infrared detector of claim 17, wherein the first substrate is used to grow the indium gallium arsenide material that forms the first layer.

19. The infrared detector of claim 17, wherein the infrared detector comprises an infrared focal plane array.

20. The infrared detector of claim 17, wherein the indium gallium arsenide material has a composition of $In_{.53}Ga_{.47}As$.

21. The infrared detector of claim 17, wherein the readout integrated circuit is electrically coupled to the first layer through bump-bond interconnects.

22. The infrared detector of claim 17, further comprising an adhesive material that physically couples the first layer to the second substrate.

23. The infrared detector of claim 17, wherein the lattice constant of the indium phosphide material differs from the lattice constant of the indium gallium arsenide material.

24. The infrared detector of claim 17, wherein a thickness of the second layer is approximately 0.05 to 0.1 μm.

25. The infrared detector of claim 17, further comprising a third layer made of a highly-doped indium phosphide material and formed on the first layer and between the first layer and the second substrate.

26. The infrared detector of claim 25, wherein a thickness of the third layer is approximately 0.3 μm.

27. The infrared detector of claim 25, wherein the second layer and the third layer passivate the indium gallium arsenide material.

* * * * *